United States Patent
Hsu et al.

(10) Patent No.: US 6,994,903 B2
(45) Date of Patent: Feb. 7, 2006

(54) HYBRID SUBSTRATE AND METHOD FOR FABRICATING THE SAME

(75) Inventors: Louis L. Hsu, Fishkill, NY (US); Li-Kong Wang, Montvale, NJ (US)

(73) Assignee: International Business Machines Corp., Armonk, NY (US)

(*) Notice: Subject to any disclaimer, the term of this patent is extended or adjusted under 35 U.S.C. 154(b) by 0 days.

(21) Appl. No.: 10/038,172

(22) Filed: Jan. 3, 2002

(65) Prior Publication Data

US 2003/0124327 A1 Jul. 3, 2003

(51) Int. Cl.
*B32B 3/00* (2006.01)
*B32B 9/04* (2006.01)

(52) U.S. Cl. .................. 428/141; 428/195.1; 428/641; 428/446; 428/698; 428/702

(58) Field of Classification Search ............... 428/141, 428/195, 641, 446, 689, 697, 698, 701, 702, 428/195.1
See application file for complete search history.

(56) References Cited

U.S. PATENT DOCUMENTS

| | | | | |
|---|---|---|---|---|
| 4,745,081 A | * | 5/1988 | Beyer et al. ................. | 438/429 |
| 4,851,078 A | * | 7/1989 | Short et al. ................. | 438/406 |
| 4,876,217 A | * | 10/1989 | Zdebel ......................... | 438/430 |
| 5,236,118 A | * | 8/1993 | Bower et al. ................ | 228/193 |
| 5,478,782 A | * | 12/1995 | Satoh et al. ................. | 438/455 |
| 5,506,433 A | * | 4/1996 | Ohori et al. ................. | 257/347 |
| 5,929,504 A | * | 7/1999 | Mogami et al. ............. | 257/510 |
| 6,159,824 A | | 12/2000 | Henley et al. .............. | 438/455 |
| 6,555,408 B1 | * | 4/2003 | Jacobsen et al. .............. | 438/28 |
| 6,611,237 B2 | * | 8/2003 | Smith ........................... | 343/772 |
| 6,657,289 B1 | * | 12/2003 | Craig et al. ................. | 257/678 |

* cited by examiner

*Primary Examiner*—Stephen Stein
(74) *Attorney, Agent, or Firm*—Satheesh K. Karra, Esq.

(57) ABSTRACT

A hybrid substrate, i.e., a substrate fabricated from different materials, and method for fabricating the same are presented. The hybrid substrate is configured for fabricating more than two different devices thereon, has a high thermal conductivity, and is configured for patterning interconnects thereon for interconnecting the different devices fabricated on the hybrid substrate.

8 Claims, 2 Drawing Sheets

HYBRID SUBSTRATE AND METHOD FOR FABRICATING THE SAME

FIELD OF THE INVENTION

This invention relates to the field of integrated circuit (IC) design. Specifically, it relates to a hybrid substrate and method for fabricating the same.

BACKGROUND OF THE INVENTION

Wafer bonding (also called wafer fusion) techniques have been extensively practiced for different applications requiring different substrates. These techniques enable two different wafers to be bonded together, so that fabrication of highly lattice-mismatched and orientation-mismatched heterostructures become possible without generating threading dislocations. For example, wafer bonding techniques have been utilized to form silicon-on-oxide (SOI) substrate, and for bonding III–V materials with other materials.

The prior art wafer bonding techniques, however, do not provide for fabricating a hybrid substrate by integrating three or more different types of material on a common carrier substrate. It is desirable to have a system chip which includes mixed devices, such as laser diodes for external communication, rf or microwave high-power, high-frequency devices for transmitting and receiving data, and high density, low-power silicon devices for logic and memory.

As an example, GaN-based high-electron mobility transistors (HEMTs) are known to have high saturation velocity and enhanced mobility in nitride semiconductor heterostructures. Accordingly, they are suitable for high-power applications at microwave frequencies. These devices are typically built on a GaN on sapphire substrate or a SiC substrate.

On the other hand, optoelectronic devices are typically built on a substrate formed by III–V materials. For example, InGaAsP/InP edge-emitting lasers are usually fabricated using InP over a silicon substrate. The bonding process entails first depositing a p-type InP substrate and capping it with a p-type InGaAs film. Second, a n-type InP substrate is deposited over the film. The n-type InP substrate is then bonded to the silicon substrate. The bonded wafer is then annealed at 400 degrees Celsius.

In order to create a sophisticated system, for example, a system having GaN based high-electron mobility-transistors and optoelectronic devices to realize more applications, it is required to integrate such different devices on more than two different substrates. It is therefore required to provide a substrate having multiple materials, i.e., a hybrid substrate, where each material can be used for fabricating one or more different devices. For example, one material can be used for fabricating the GaN based high-electron mobility-transistors, another material can be used for fabricating the opto-electronic devices, and another material can be used for high-density, low-power Si-based devices.

Additionally, by providing a hybrid substrate, chips fabricated from different materials can be fabricated on the hybrid substrate. For example, a first part of the hybrid substrate can be used for fabricating a GaAs chip, a second part of the hybrid substrate can be used for fabricating a InP chip, and a third part of the hybrid substrate can be used for fabricating a silicon chip.

SUMMARY

An aspect of the present invention is to provide a hybrid substrate, i.e., a substrate fabricated from different materials, and method for fabricating the same.

Another aspect of the present invention is to provide a hybrid substrate configured for fabricating more than two different devices thereon.

Further, another aspect of the present invention is to provide a hybrid substrate having a high thermal conductivity.

Finally, another aspect of the present invention is to provide a hybrid substrate configured for patterning interconnects thereon for interconnecting different devices fabricated on the hybrid substrate. This would greatly reduce the size of a system fabricated on the hybrid substrate, since the patterned interconnects would eliminate contact pads, and wide metal wirings used in prior art systems. Further, inductive noise caused by the wide metal wirings would also be reduced.

These aspects are realized by the present invention which provides a hybrid substrate. The hybrid substrate is configured for fabricating more than two different devices thereon, has a high thermal conductivity, and is configured for patterning interconnects thereon for interconnecting the different devices fabricated on the hybrid substrate. The hybrid substrate includes a substrate having a plurality of pockets patterned thereon; and at least two different materials provided within a respective pocket of the plurality of pockets. The at least two different materials are planarized, such that a top surface of the at least two different materials is approximately co-planar with a top surface of the substrate. Further, the at least two different materials are bonded to the substrate.

Further, the present invention presents a method for fabricating the hybrid substrate. The method includes the steps of patterning a substrate with a plurality of pockets; and providing a material within each of the plurality of pockets, wherein at least two materials provided within two respective pockets of the plurality of pockets are different. The method further includes the step of planarizing the materials provided within each of the plurality of pockets, such that a top surface of the materials is approximately co-planar with a top surface of the substrate. Further still, the method includes the step of providing a thermal conductivity layer between the substrate and the material provided within each of the plurality of pockets.

DETAILED DESCRIPTION OF THE INVENTION

The present invention provides a hybrid substrate, i.e., a substrate fabricated from different materials, and method for fabricating the same. The hybrid substrate is configured for fabricating more than two different devices thereon, has a high thermal conductivity, and is configured for patterning interconnects thereon for interconnecting the different devices fabricated on the hybrid substrate.

Figure 1:
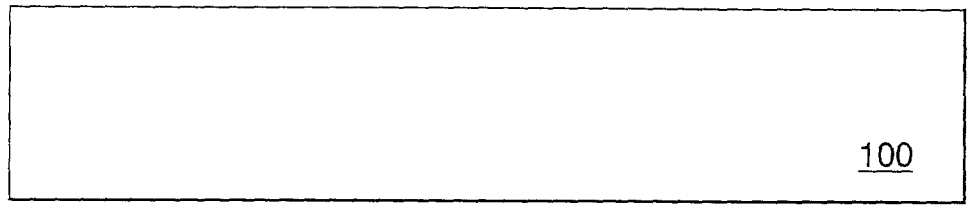
FIG. 1 is a cross-sectional view of a portion of a carrier substrate for fabricating the hybrid substrate according to the present invention.

FIG. 1 is a cross-sectional view of a portion of a carrier substrate 100 for fabricating the hybrid substrate according to the present invention. The carrier substrate 100 is preferably fabricated from aluminum nitride (AlN). AlN is a desirable substrate for the carrier substrate 100 due to its ability to support a wide variety of materials provided thereon due to its high thermal conductivity. Other preferred materials for the carrier substrate 100 include quartz, glass, ceramic, CVD diamond, and sapphire.

A description of the preferred method for fabricating the hybrid substrate will now be provided. With reference to FIGS. 2–6 there are shown cross-sectional views of the preferred method for fabricating the hybrid substrate.

Figure 2:
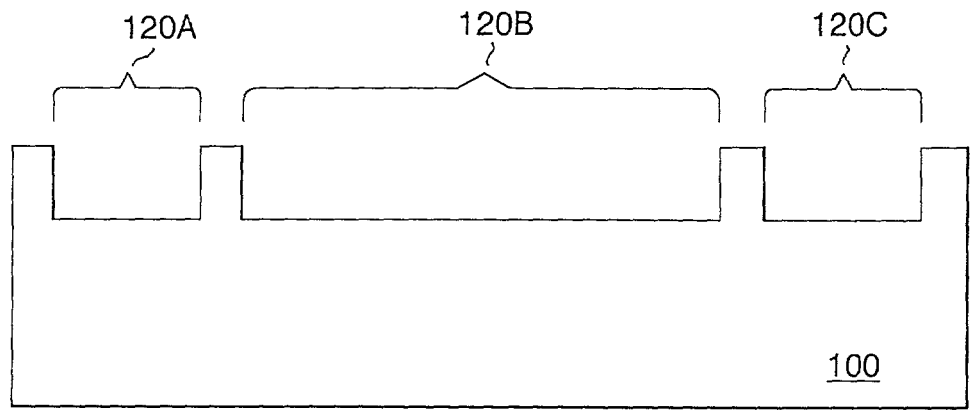
FIGS. 2–6 are cross-sectional views illustrating a preferred process for fabricating the hybrid substrate according to the present invention.

With reference to FIG. 2, the carrier substrate 100 is patterned and etched to form pockets 120A, 120B, and 120C. The pockets 120A, 120B, and 120C will be used to place different materials therein. The depth of the pockets 120A, 120B, and 120C is in the range of 5 um to 50 um.

Figure 3:
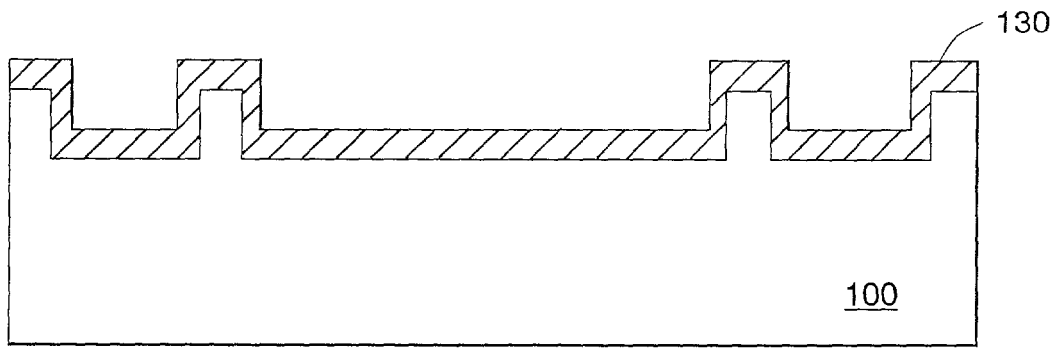

With reference to FIG. 3, a layer of CVD diamond 130 is deposited over the etched carrier substrate. CVD diamond is preferred since it has very good thermal conductivity in dissipating heat generated from the various devices provided over the hybrid substrate. The thickness of the layer of CVD diamond is in the range of 100 nm to 1000 nm.

Figure 4:
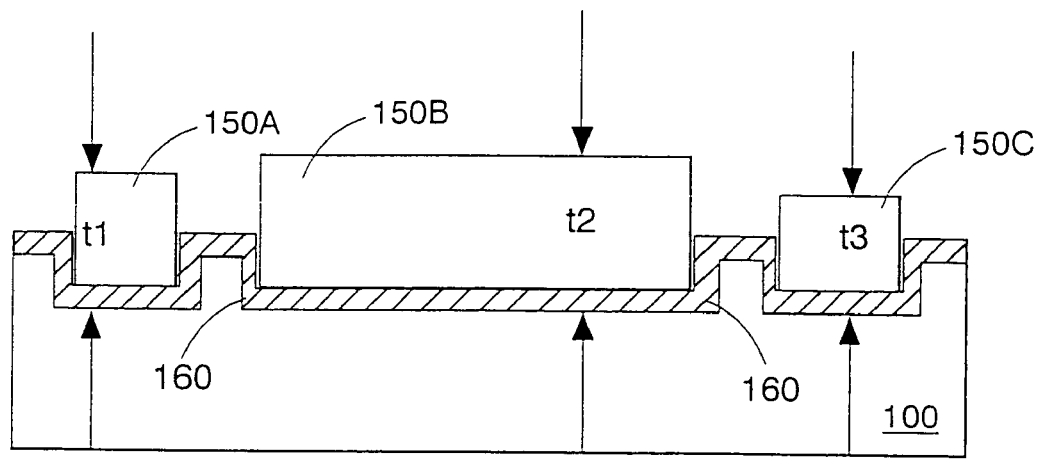

With reference to FIG. 4, different materials, such as GaAs, InP, and silicon wafer, 150A, 150B, and 150C, respectively, are provided within the pockets 120A, 120B, and 120C. These materials may have different thicknesses, e.g., t1, t2, and t3, respectively. Preferably, as indicated by reference numeral 160 in FIG. 4, there is a gap between each cut material and the layer of CVD diamond 130, since the cut material size is slightly smaller than the etched pocket dimensions to guarantee that each cut material can fit into its respective pocket. It is contemplated that other materials can be provided within the pockets 120A, 120B, and 120C besides GaAs, InP and silicon wafer, such as GaN-based high-electron mobility transistors (HEMTs) and optoelectronic devices formed by III–V materials, such as InGaAsP/InP edge-emitting lasers fabricated using InP over a silicon substrate.

Further, it is preferable to apply a thin oxide layer on top of each material 150A, 150B, and 150C before dicing. This oxide layer is faced to the deposited diamond CVD layer 130 to enhance bonding strength between the different materials 150A, 150B, and 150C and the carrier substrate 100, after preferably applying an annealing step to adhere the materials 150A, 150B, and 150C to the carrier substrate 100.

Prior to dicing the materials 150A, 150B, and 150C, the materials 150A, 150B, and 150C can be prepared using the blister separation method as known in the art, e.g., the blister separation method described in U.S. Pat. No. 6,159,824, in order that a major portion of the materials 150A, 150B, and 150C can easily be removed before planarizing the materials 150A, 150B, and 150C as further described below with reference to FIG. 6. The removed portions of each material 150A, 150B, and 150C can possibly be used again in manufacturing another system chip device to save on material costs.

Figure 5:
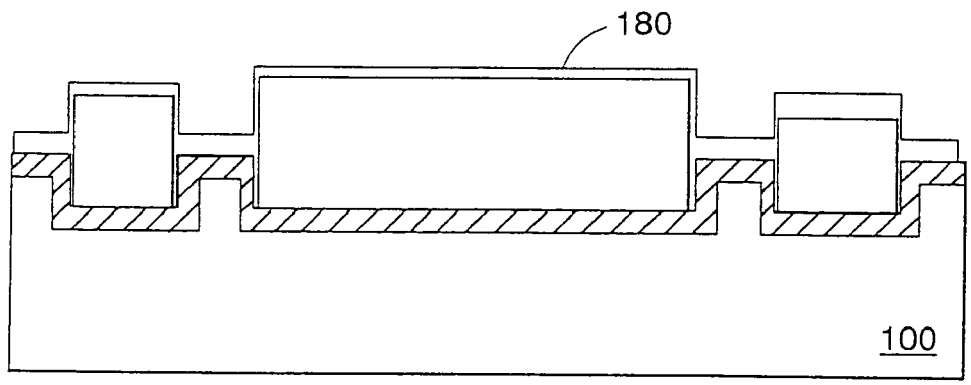

With reference to FIG. 5, a layer of CVD oxide 180 is deposited to cover the surface. After the layer of CVD oxide 180 is deposited, a final annealing process is performed. The layer of CVD oxide 180 fills in the gaps between the materials 150A, 150B, and 150C and the pockets 120A, 120B, and 120C.

Figure 6:
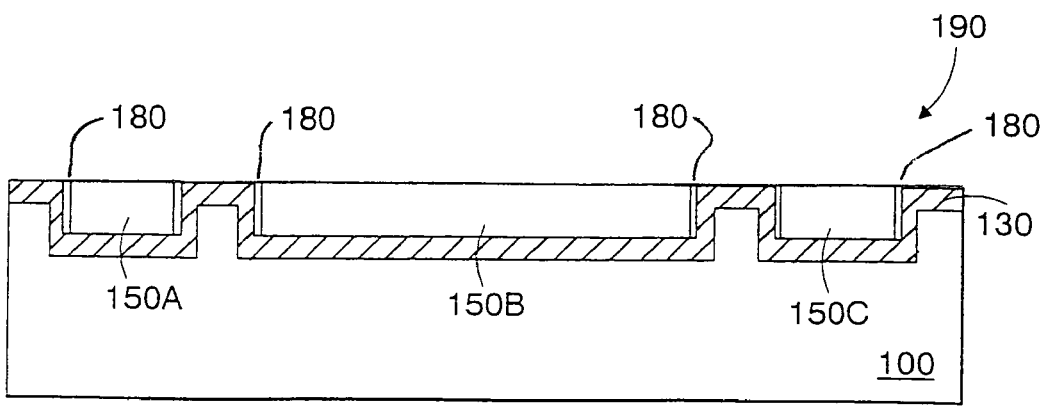

With reference to FIG. 6, a chem-mech polish step is performed to planarize the materials 150A, 150B, and 150C to the diamond film surface 130. After the chem-mech polish step, all the materials 150A, 150B, and 150C are approximately co-planar with the diamond film surface 130.

The finished hybrid substrate designated by reference numeral 190 in FIG. 6 is ready for fabricating different devices thereon. Preferably, common interconnect structures can be provided to interconnect the different materials 150A, 150B, and 150C and to provide for communications between the different materials 150A, 150B, and 150C.

The advantages of the hybrid substrate 190 of the present invention are the following: (1) no alignment is required when merging the prefabricated chips together on one carrier substrate, as opposed to performing a precision alignment, as in the prior art, when merging prefabricated chips; (2) devices are fabricated on surfaces which are fully planarized, as opposed to fabricating the devices are non-planarized surfaces, as in the prior art, which makes it difficult to interconnect the devices; (3) the process of bonding the materials 150A, 150B, and 150C is less complicated and prone to defects, since there are no devices fabricated on the materials 150A, 150B, and 150C when the materials 150A, 150B, and 150C are bonded to the carrier substrate 100, as is the case with prior art methods where prefabricated chips and/or devices are bonded to the substrate (since in the prior art methods prefabricated chips and/or devices are bonded to the substrate, the bonding process cannot be performed at high temperatures, since at high temperatures the chips and/or devices could be damaged); and (4) the surface of the hybrid substrate is free from seams, since the CVD oxide layer 180 overlays the surface of the hybrid substrate and fills in any gaps within the hybrid substrate. Therefore, the materials 150A, 150B, and 150C cannot be contaminated by

We claim:

1. A hybrid substrate comprising:
    a carrier substrate having a plurality of pockets patterned thereon;
    at least two substrates, each substrate being formed from a different material and being deposited within a separate pocket of the plurality of pockets such that at least a portion of the at least two substrates protrudes above the surface of the carrier substrate, for fabricating a plurality of devices; and
    an oxide layer deposited upon the carrier substrate so as to fill any gaps between each of the at least two substrates and the pocket.

2. The hybrid substrate according to claim 1, wherein the at least two substrates are different from each other.

3. The hybrid substrate according to claim 1, wherein the at least two substrates are different from each other and are bonded to the carrier substrate.

4. The hybrid substrate according to claim 1, wherein each of the at least two different substrates are selected from the group consisting of GaAs, InP, silicon (Si), substrate materials for optoelectronic devices, and GaN-based substrate materials for high-electron mobility transistors (HEMTs).

5. The hybrid substrate according to claim 1, wherein the carrier substrate is selected from the group consisting of AlN, quartz, glass, ceramic, CVD diamond, and sapphire.

6. The hybrid substrate according to claim 1, wherein the carrier substrate is a high thermal conductive substrate.

7. The hybrid substrate according to claim 1, wherein each pocket of the plurality of pockets has a greater surface area than a surface area of a cross-section of a substrate deposited within that pocket.

8. The hybrid substrate according to claim 1, wherein the at least two substrates and the carrier substrate are each formed from a different material.

* * * * *